US008883557B1

(12) United States Patent
Hsueh et al.

(10) Patent No.: US 8,883,557 B1
(45) Date of Patent: Nov. 11, 2014

(54) CONTROLLING COMPOSITION OF MULTIPLE OXIDES IN RESISTIVE SWITCHING LAYERS USING ATOMIC LAYER DEPOSITION

(71) Applicants: Intermolecular Inc., San Jose, CA (US); Kabushiki Kaisha Toshiba, Tokyo (JP); SanDisk 3D LLC, Milpitas, CA (US)

(72) Inventors: Chien-Lan Hsueh, Campbell, CA (US); Vidyut Gopal, Sunnyvale, CA (US); Randall J. Higuchi, San Jose, CA (US); Takeshi Yamaguchi, Kanagawa (JP)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 14/016,775

(22) Filed: Sep. 3, 2013

(51) Int. Cl.
*H01L 21/00* (2006.01)
*H01L 21/16* (2006.01)
*H01L 29/02* (2006.01)
*H01L 47/00* (2006.01)
*H01L 45/00* (2006.01)

(52) U.S. Cl.
CPC ........ *H01L 45/1616* (2013.01); *H01L 45/1253* (2013.01)
USPC ................................ 438/104; 257/2; 257/43

(58) Field of Classification Search
USPC ........................................ 438/104; 257/2, 43
See application file for complete search history.

(56) References Cited

U.S. PATENT DOCUMENTS

| 7,084,078 | B2 | 8/2006 | Ahn et al. | |
|---|---|---|---|---|
| 8,023,318 | B2 | 9/2011 | Hwang | |
| 2006/0171200 | A1 | 8/2006 | Rinerson et al. | |
| 2006/0228868 | A1 | 10/2006 | Ahn | |
| 2010/0006918 | A1 | 1/2010 | Ahn | |
| 2010/0181545 | A1* | 7/2010 | Hsieh et al. | 257/2 |
| 2010/0308298 | A1* | 12/2010 | Ninomiya et al. | 257/5 |
| 2011/0108929 | A1 | 5/2011 | Meng | |
| 2011/0297927 | A1* | 12/2011 | Ramaswamy et al. | 257/43 |
| 2013/0034947 | A1* | 2/2013 | Hong et al. | 438/384 |

OTHER PUBLICATIONS

Chen, P., et al.; HfOx Thin Films for Resistive Memory Device by Use of Atomic Layer Deposition; Jan. 1, 2007; Industrial Technology Research Institute; Mater. Res. Soc. Symp. Proc. vol. 997 2007 Materials Research Society.

Kim, S., et al.; High dielectric constant TiO2 thin films on a Ru electrode grown at 250 C by AtomicLayer Deposition; Nov. 1, 2004; Seoul National University Industry Foundation; Applied Physics Letters V.85 N. 18 11 2004.

(Continued)

*Primary Examiner* — Karen Kusumakar

(57) ABSTRACT

A method of fabricating a resistive random access memory (ReRAM) cell may include forming a set of nanolaminate structures over an electrode, such that each structure includes at least one first element oxide layer and at least one second element oxide layer. The overall set is operable as a resistive switching layer in a ReRAM cell. In this set, an average atomic ratio of the first element to the second element is different in at least two nanolaminate structures. This ratio may be less in nanolaminate structures that are closer to electrodes than in the middle nanolaminate structures. Alternatively, this ratio may increase from one end of the set to another. The first element may be less electronegative than the second elements. The first element may be hafnium, while the second element may be one of zirconium, aluminum, titanium, tantalum, or silicon.

20 Claims, 6 Drawing Sheets

(56) References Cited

OTHER PUBLICATIONS

Kim, K., et al.; Atomic Layer Deposition of Insulating Nitride Interfacial Layers for Germanium Metal Oxide Semiconductor Field Effect Transistors with Highk OxideTungsten Nitride Gate Stacks; May 21, 2007; Harvard, College (US) ; Applied Physics Letters pp. 9092.

Domaradzki, J., et al.; Characterization of Nanocrystalline TiOsHfO2 Thin Films Prepared by Low Pressure Hot Target Reactive Magnetron Sputtering; Jan. 1, 2006; Z—Book—Elsevier; Suraface and Coatings pp. 62836287.

* cited by examiner

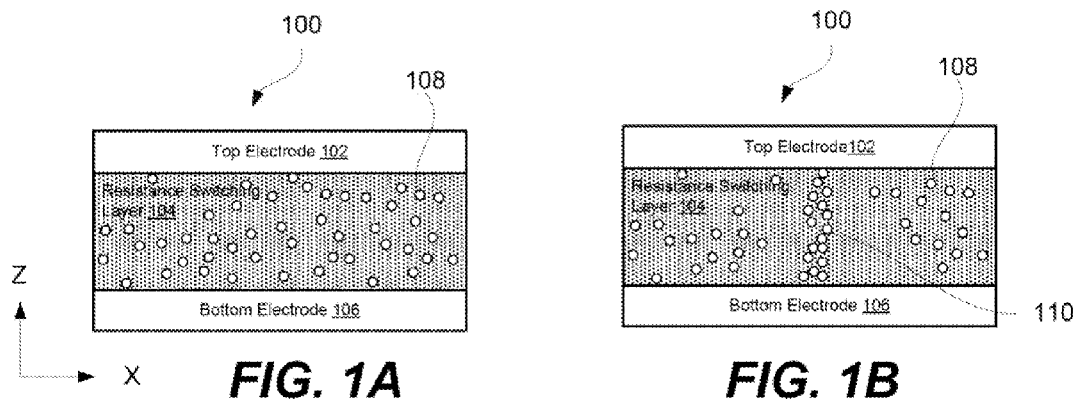
*FIG. 1A*  *FIG. 1B*
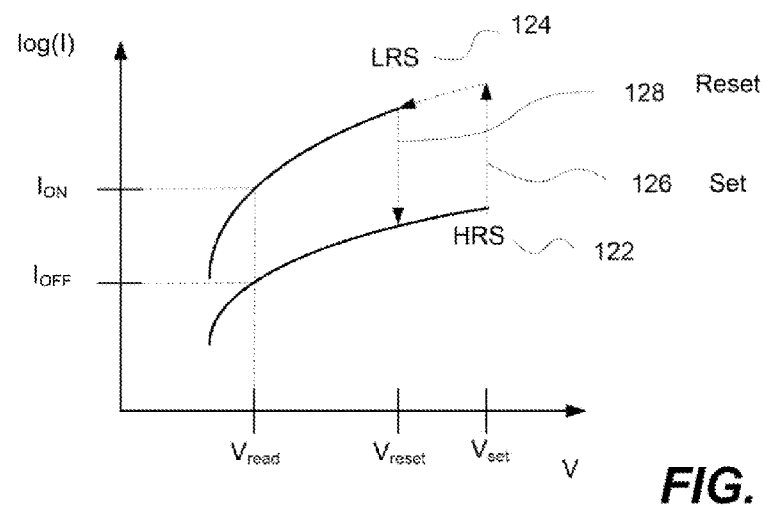
*FIG. 2*

CONTROLLING COMPOSITION OF MULTIPLE OXIDES IN RESISTIVE SWITCHING LAYERS USING ATOMIC LAYER DEPOSITION

TECHNICAL FIELD

The present invention relates generally to non-volatile memory devices and more specifically to controlling composition of multiple oxides in resistive switching layers using atomic layer deposition (ALD).

BACKGROUND

Nonvolatile memory is computer memory capable of retaining stored information even when unpowered. Nonvolatile memory is typically used for secondary storage or long-term persistent storage and may be used in addition to volatile memory, which loses the stored information when unpowered. Nonvolatile memory can be permanently integrated into computer systems (e.g., solid state hard drives) or can take the form of removable and easily transportable memory cards (e.g., USB flash drives). Nonvolatile memory is becoming more popular because of its small size/high density, low power consumption, fast read and write rates, retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory, are being developed to meet these demands and requirements.

SUMMARY

Provided are resistive random access memory (ReRAM) cells and methods of fabricating thereof. A method may include forming a set of nanolaminate structures over an electrode, such that each structure includes at least one first element oxide layer and at least one second element oxide layer. The overall set is operable as a resistive switching layer in a ReRAM cell. In this set, an average atomic ratio of the first element to the second element is different in at least two nanolaminate structures. This ratio may be less in nanolaminate structures that are closer to electrodes than in the middle nanolaminate structures. Alternatively, this ratio may increase from one end of the set to another. Such distributions of the two elements help to improve resistive switching characteristics. The first element may be less electronegative than the second elements. In some embodiments, the first element is hafnium, while the second element is one of zirconium, aluminum, titanium, tantalum, and silicon.

In some embodiments, a method of fabricating a resistive random access memory cell involves providing a substrate comprising a first electrode, forming a first nanolaminate structure over the first electrode, and forming a second nanolaminate structure over the first nanolaminate structure. The first nanolaminate structure and the second nanolaminate structure may be formed using an atomic layer deposition (ALD) technique. Each one of the first nanolaminate structure and the second nanolaminate structure includes at least one layer of an oxide of a first element and at least one layer of an oxide of a second element. As used herein, an "oxide of an element" may include additional components besides the element and oxygen, including but not limited to a dopant or alloy. In some embodiments, the first element and the second element may be metals, metalloids, semiconductors, or their alloys. The first element may be less electronegative than the second element. The average atomic ratio of the first element to the second element in the first nanolaminate structure may be less than an average atomic ratio of the first element to the second element in the second nanolaminate structure; in some embodiments, over 50% less. The first nanolaminate structure and the second nanolaminate structure are parts of a resistive switching layer of the resistive random access memory cell.

In some embodiments, the method involves forming a third nanolaminate structure over the second nanolaminate structure. The third nanolaminate structure includes at least one layer of the oxide of the first element and at least one layer of the oxide of the second element. The average atomic ratio of the first element to the second element in the third nanolaminate structure may be different than the average atomic ratio of the first element to the second element in the second nanolaminate structure. For example, the average atomic ratio of the first element to the second element in the third nanolaminate structure may be less than the average atomic ratio of the first element to the second element in the second nanolaminate structure. In some embodiments, the second nanolaminate structure has the highest atomic ratio of the first element to the second element as among the first nanolaminate structure, the second nanolaminate structure, and the third nanolaminate structure. In some embodiments, the second nanolaminate structure may be the middle nanolaminate structure in the entire stack of structures and may have the same number of other nanolaminate structures separating it from each of two electrodes. The average atomic ratio of the first element to the second element in the third nanolaminate structure may be about the same as the average atomic ratio of the first element to the second element in the first nanolaminate structure.

In some embodiments, the average atomic ratio of the first element to the second element in the third nanolaminate structure is greater than the average atomic ratio of the first element to the second element in the second nanolaminate structure. In some embodiments, the third nanolaminate structure has the highest atomic ratio of the first element to the second element among the first nanolaminate structure, the second nanolaminate structure, and the third nanolaminate structure. In some embodiments, the third nanolaminate structure may be the middle nanolaminate structure in the entire stack of structures and may have the same number of other nanolaminate structures separating it from each of two electrodes. In some embodiments, the average atomic ratio of the first element to the second element in the third nanolaminate structure is at least four times greater than the average atomic ratio of the first element to the second element in the first nanolaminate structure.

In some embodiments, the average atomic ratio of the first element to the second element in the first nanolaminate structure is between about 0.5 and 2. In some embodiments, the average atomic ratio of the first element to the second element in the second nanolaminate structure is between about 2 and 4.

In some embodiments, the method involves forming a second electrode over the second nanolaminate structure, such that the resistive switching layer is disposed between the first electrode and the second electrode. The nanolaminate structure having the highest average atomic ratio of the first element to the second element may be separated by at least one other nanolaminate structure from the first electrode and separated by at least one other nanolaminate structure from the second electrode. Alternatively, the nanolaminate structure having the highest average atomic ratio of the first element to the second element may have an interface with one of the electrodes.

In some embodiments, the first nanolaminate structure is formed by depositing an equal number of layers of the oxide of the first element and the oxide of the second element. The oxide layers of the different elements may alternate in the first nanolaminate structure. In some embodiments, the first element may be hafnium. The second element may be one of zirconium, aluminum, titanium, tantalum, or silicon. Specifically, the second element may be titanium. In some embodiments, at least one of the layers of the second nanolaminate structure includes a non-stoichiometric oxide. In some embodiments, at least one of the layers of the first nanolaminate structure comprises a non-stoichiometric oxide. The thickness of the resistive switching layer may be between about 20 Angstroms and 100 Angstroms.

Provided also is a ReRAM cell including a first electrode, a second electrode, and a resistive switching layer disposed between the first electrode and the second electrode. The resistive switching layer includes a first nanolaminate structure and a second nanolaminate structure. Each one of the first nanolaminate structure and the second nanolaminate structure includes at least one layer of an oxide of a first element and at least one layer of an oxide of a second element. The average atomic ratio of the second element to the first element in the first nanolaminate structure is different from an average atomic ratio of the second element to the first element in the second nanolaminate structure.

These and other embodiments are described further below with reference to the figures.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which:

FIGS. 1A and 1B illustrate schematic representations of a ReRAM cell in its high resistive state (HRS) and low resistive state (LRS), in accordance with some embodiments.

FIG. 2 illustrates a plot of a current passing through a ReRAM cell as a function of a voltage applied to the ReRAM cell, in accordance with some embodiments.

DETAILED DESCRIPTION OF EXAMPLE EMBODIMENTS

Figure 3A:
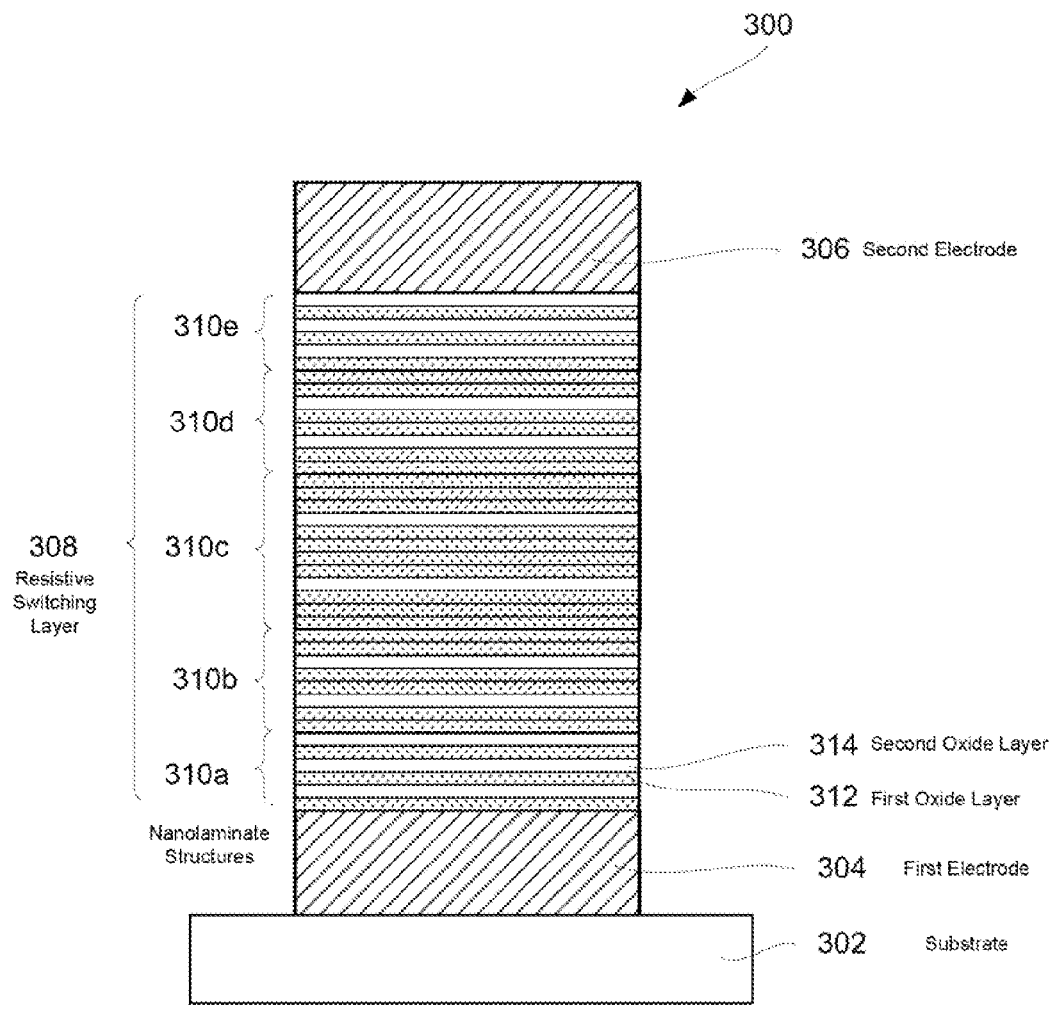
FIG. 3A illustrates a schematic representation of a ReRAM cell including multiple nanolaminate structures, in accordance with some embodiments.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

Introduction

A ReRAM cell exhibiting resistive switching characteristics generally includes multiple layers formed into a stack, such as a "metal-insulator-metal" (MIM) stack. The stack includes two conductive layers operating as electrodes, which are identified as "M" and may include a metal, but may also include other types of conductive materials, such as doped silicon. The stack also includes an insulator layer provided in between the two electrodes and identified as "I". The insulator layer changes its resistive properties when certain switching voltages are applied to the layer or, more generally, to the ReRAM cell including this layer. Due to its variable resistance characteristics, the insulator layer may be also referred to as a variable resistance layer. These changes in resistive properties are used to store data. For example, when two different resistive states are identified (e.g., a high resistive state and a low resistive state) for a ReRAM cell, one state may be associated with a logic "zero", while the other state may be associated with a logic "one" value. Similar approaches may be used when three or more resistive states may be identified for the same ReRAM cell leading to various multibit architectures.

The switching voltages may be applied as series of pulses and may be generally referred to as switching voltage profiles or, more specifically, set voltage profiles and reset voltage profiles as further described below. For example, a writing voltage pulse of an above-threshold magnitude may be used to change ("set" or "reset") the resistive state. A smaller reading voltage pulse may be used to determine the current state of the ReRAM cell without changing it. When multiple switching pulses are used, these switching pulses may alternate with the reading pulses for feedback control.

Various theoretical models have been proposed to characterize this resistive switching phenomenon. Some of these models are described below. Different approaches of tailoring resistive switching characteristics, such as reducing switching voltages, have been undertaken. Without being restricted to any particular theory, it is believed that distribution of oxygen vacancies and electrochemical migration of the oxygen vacancies play a key role in resistive switching in resistive switching layers that are formed from oxides, such as transition metal oxides, silicon oxides, and other suitable oxides.

Combining two oxides in the same resistive switching layer has yielded promising results. For example, two elements having different electro-negativities, such as hafnium oxide and titanium oxide, may be combined in the same resistive switching layer. The two elements compete for oxygen within the resistive switching layer. The oxide layers of these elements may form one or more interfaces within the resistive switching layer. These interfaces are believed to be responsible for forming or breaking conductive filaments. Distribution of the two oxides with the resistive switching layer, thicknesses of the layers of these oxides, stoichiometry and other physical characteristics may be tuned to achieve desirable resistive switching, repeatability, and performance characteristics of the ReRAM cell.

Physical vapor deposition (PVD) and chemical vapor deposition (CVD), which are commonly used for semiconductor processing, provide an insufficient level of control when fabricating a resistive switching layer including two oxides. For example, it has been found that resistive switching layers in which two oxides form multiple interfaces yield better performance than resistive switching layers having a single interface or resistive switching layers having uniform distribution of two oxides. The multiple interfaces can be formed when multiple layers of one or both oxides are within the same resistive switching layer, which in this case may be referred to as a resistive switching stack. For example, multiple hafnium oxide sub-layers may alternate with multiple titanium oxides sub-layers in the same stack, forming multiple hafnium oxide-titanium oxide interfaces.

ALD techniques allow forming such multiple interfaces and controlling composition of multiple oxides in a resistive switching stack. A specific example may help to illustrate flexibility of the ALD techniques and options available when forming a resistive switching stack. Each ALD cycle may deposit an oxide layer with an average thickness between about 0.5 Angstroms and 1 Angstrom (note that a "sub-monolayer" that does not completely cover the underlying surface may have an average thickness less than the diameter of the deposited atom or molecule). Furthermore, a composition of the deposited layer may change with each cycle. For example, one cycle may be used to deposit hafnium oxide. The next cycle may be used to deposit titanium oxide. Furthermore, stoichiometry of each deposited layer and, in some embodiments, other characteristics may be controlled independently.

For example, when two metal oxides deposited as 1 Angstrom thick layers are used to fabricate a resistive switching stack having a thickness of about 30 Angstroms, about 1 billion different spatial arrangement combinations (i.e., $2^{30}$) of the two metal oxide layers are available (i.e., how these two metal oxide layers can be arranged within the resistive switching stack). As such, various different distributions of metal oxides, different interfaces, and other structural characteristics are possible when ALD techniques are used to form a resistive switching layer.

In some embodiments, metal oxide layers are grouped into nanolaminate structures, such that each nanolaminate structure includes at least one layer of an oxide of a first element and at least one layer of an oxide of a second element. A resistive switching layer includes at least two nanolaminate structures, such that the average atomic ratio of the first element to the second element in one nanolaminate structure is less than an average atomic ratio of the first element to the second element in the other nanolaminate structure. This ratio may be less in nanolaminate structures that are closer to electrodes than in the middle nanolaminate structures. Alternatively, this ratio may increase from one end of the set to another. Such distributions of the two elements help to improve resistive switching characteristics. The first element may be less electronegative than the second elements. In some embodiments, the first element is hafnium, while the second element is one of zirconium, aluminum, titanium, tantalum, and silicon. In some embodiments, additional nanolaminate structures may be used as further described below.

Examples of ReRAM Cells and their Switching Mechanisms

A brief description of ReRAM cells is provided for better understanding of various features of resistive switching layers described in this document. A ReRAM cell includes a resistive switching layer formed from a dielectric material exhibiting resistive switching characteristics. A dielectric, which is normally insulating, can be made to conduct through one or more filaments or conduction paths formed after application of a sufficiently high voltage. The conduction path formation can arise from different mechanisms, including defects, metal migration, and other mechanisms further described below. Once the one or more filaments or conduction paths are formed in the dielectric component of a memory device, these filaments or conduction paths may be reset (or broken resulting in a high resistance) or set (or re-formed resulting in a lower resistance) by applying certain voltages.

FIG. 1A illustrates a schematic representation of ReRAM cell 100 including top electrode 102, bottom electrode 106, and resistive switching layer 104 provided in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", may be used identify and distinguish the two electrodes. ReRAM cell 100 may also include other components, such as current limiting layers, diodes, and other components.

Resistive switching layer 104 may be initially formed from a dielectric material. It later can be made to conduct through one or more filaments or conduction paths formed by applying first a forming voltage (after initial fabrication) and later a set voltage (during operation). To provide this resistive switching functionality, resistive switching layer 104 includes a concentration of electrically active defects 108, which are sometimes referred to as traps. For example, some charge carriers may be absent from the structure (i.e., vacancies) and/or additional charge carriers may be present (i.e., interstitials) representing defects 108. In some embodiments, defects may be formed by impurities (i.e., substitutions). These defects may be utilized for ReRAM cells operating according to a valence change mechanism, which may occur in specific transition metal oxides and is triggered by a migration of anions, such as oxygen anions. Migrations of oxygen anions may be represented by the motion of the corresponding vacancies, i.e., oxygen vacancies. A subsequent change of the stoichiometry in the transition metal oxides leads to a redox reaction expressed by a valence change of the cation sub-lattice and a change in the electrical conductivity. In this example, the polarity of the pulse used to perform this change determines the direction of the change, i.e., reduction or oxidation. Other resistive switching mechanisms include bipolar electrochemical metallization mechanisms and thermochemical mechanisms, which leads to a change of the stoichiometry due to a current-induced increase of the temperature.

Without being restricted to any particular theory, it is believed that defects 108 can be reoriented within resistive switching layer 104 to form filaments or conduction paths as, for example, schematically shown in FIG. 1B as element 110. This reorientation of defects 108 occurs when a set voltage or a forming voltage is applied to electrodes 102 and 106. Sometimes, reorientation of defects 108 is referred to as "filling the traps" when a set voltage is applied (to form one or more filaments or conduction paths) and "emptying the traps" when a reset voltage is applied (to break the previously formed filaments or conduction paths).

Defects 108 can be introduced into resistive switching layer 104 during or after its fabrication. For example, a concentration of oxygen deficiencies can be introduced into metal oxides during their deposition or during subsequent annealing.

Operation of ReRAM cell 100 will now be briefly described with reference to FIG. 2 illustrating a logarithmic plot of a current passing through a unipolar ReRAM cell as a function of a voltage applied between the electrodes of the ReRAM cell, in accordance with some embodiments. Similar characteristics are demonstrated by bipolar cells, additional details of which are further presented below. ReRAM cell 100 may be either in a low resistive state (LRS) defined by line 124 or high resistive state (HRS) defined by line 122. Each of these resistive states is used to store a different logic state, e.g., HRS may be read as logic "one" and LRS may be read as logic "zero," or vice versa. Therefore, each ReRAM cell that has two resistive states may be used to store one bit of data. It should be noted that some ReRAM cells may have three and even more resistive states allowing multi-bit storage in the same cell.

HRS and LRS correspond to the presence or absence of one or more filaments or conductive paths in resistive switching layer 104 and of connections between these filaments or conduction paths and the two electrodes 102 and 106. For example, a ReRAM cell may be initially fabricated in LRS and then switched to HRS, or vice versa. A ReRAM cell may be switched back and forth between LRS and HRS many times, defined by set and reset cycles. Furthermore, a ReRAM cell may maintain its LRS or HRS for a substantial period of time and withstand a number of read cycles.

The overall operation of ReRAM cell 100 may be divided into a read operation, set operation (i.e., turning the cell "ON"), and reset operation (i.e., turning the cell "OFF"). Set and reset operations may be referred to as write operations. During the read operation, the state of ReRAM cell 100 (more specifically, the resistive state of resistive switching layer 104) can be sensed by applying a sensing voltage to electrodes 102 and 106. The sensing voltage is sometimes referred to as a "READ" voltage and indicated as $V_{READ}$ in FIG. 2. If ReRAM cell 100 is in HRS represented by line 122, the external read and write circuitry connected to electrodes 102 and 106 will sense the resulting "OFF" current ($I_{OFF}$) that flows through ReRAM cell 100. As stated above, this read operation may be performed multiple times without switching ReRAM cell 100 between HRS and LRS. In the above example, the ReRAM cell 100 should continue to output the "OFF" current ($I_{OFF}$) when the read voltage ($V_{READ}$) is applied to the electrodes.

Continuing with the above example, when it is desired to switch ReRAM cell 100 into a different logic state (corresponding to LRS), ReRAM cell 100 is switched from its HRS to LRS. This operation is referred to as a set operation. This may be accomplished by using the same read and write circuitry to apply a set voltage ($V_{SET}$) to electrodes 102 and 106. Applying the set voltage ($V_{SET}$) forms one or more filaments or conduction paths in resistive switching layer 104 and switches ReRAM cell 100 from its HRS to LRS as indicated by arrow 126. It should be noted that formation or breaking of filaments or conduction paths in resistive switching layer 104 may also involve forming or breaking electrical connections between these filaments and one (e.g., reactive electrode) or both electrodes. The factor is passage of the current between the two electrodes.

In LRS, the resistive characteristics of ReRAM cell 100 are represented by line 124. In this LRS, when the read voltage ($V_{READ}$) is applied between electrodes 102 and 106, the external read and write circuitry will sense the resulting "ON" current ($I_{ON}$) that flows through ReRAM cell 100. Again, this read operation may be performed multiple times without switching ReRAM cell 100 between LRS and HRS.

It may be desirable to switch ReRAM cell 100 into a different logic state again by switching ReRAM cell 100 from its LRS to HRS. This operation is referred to as a reset operation and should be distinguished from set operation during which ReRAM cell 100 is switched from its HRS to LRS. During the reset operation, a reset voltage ($V_{RESET}$) is applied to ReRAM cell 100 to break the previously formed filaments or conduction paths in resistive switching layer 104, switching ReRAM cell 100 from its LRS to HRS as indicated by arrow 128. Reading of ReRAM cell 100 in its HRS is described above. Overall, ReRAM cell 100 may be switched back and forth between its LRS and HRS many times. Read operations may be performed in each of these states (between the switching operations) one or more times or not performed at all. It should be noted that application of set and reset voltages to change resistive states of the ReRAM cell involves complex mechanisms that are believed to involve localized resistive heating as well as mobility of defects impacted by both temperature and applied potential.

ReRAM cell 100 may be configured to have either unipolar switching or bipolar switching. The unipolar switching does not depend on the polarity of the set voltage ($V_{SET}$) and reset voltage ($V_{RESET}$) applied to the electrodes 102 and 106 and, as a result, to resistive switching layer 104. In the bipolar switching, the set voltage ($V_{SET}$) and reset voltage ($V_{RESET}$) applied to resistive switching layer 104 need to have different polarities.

In some embodiments, the set voltage ($V_{SET}$) is between about 100 mV and 10V or, in some embodiments, between about 500 mV and 5V. The length of set voltage pulses ($t_{SET}$) may be less than about 100 milliseconds, less than about 5 milliseconds, or even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, in some embodiments, greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$).

A ratio of set and reset currents (i.e., an $I_{SET}/I_{RESET}$ ratio) that corresponds to a set voltage ($V_{SET}$) and reset voltage ($V_{RESET}$) may be at least about 5 or, in some embodiments, at least about 10 to make the state of ReRAM cell easier to determine. ReRAM cells should be able to cycle between LRS and HRS at least about $10^3$ times or, in some embodiments, at least about $10^7$ times without failure. A data retention time ($t_{RET}$) should be at least about 5 years or, in some embodiments, at least about 10 years at a thermal stress up to 85° C. and small electrical stress, such as a constant application of the read voltage ($V_{READ}$). Other considerations may include low current leakage, such as less than about 40 A/cm$^2$ measured at 0.5 V per 20 Å of oxide thickness in HRS.

In some embodiments, the same ReRAM cell may include two or more resistive switching layers interconnected in series. Pairs of resistive switching layers may directly contact each other, or they may be separated by one or more intermediate layers.

In some embodiments, a ReRAM cell is subjected to a forming operation, during which the initially insulating properties of the resistive switching layer are altered and the ReRAM cell is configured into the initial LRS or HRS. The forming operation may include a very short high discharge current peak associated with a forming voltage. The LRS level of the resistive switching layer for subsequent switching is determined by the filaments or connections created by the forming operation. If the forming operation makes the resistive-switching layer too conductive, the cell may be difficult to reset. In this case, a resistive switching layer with very low levels of resistance in the LRS may be limited in terms of scaling down. This difficulty may be resolved by positioning such resistive switching layers in series with other components providing additional resistance to the overall ReRAM cell.

Examples of ReRAM Cells Having Multiple Nanolaminate Structures

FIG. 3A is a schematic illustration of ReRAM cell 300, in accordance with some embodiments. ReRAM cell 300 may be disposed on substrate 302 that may include other ReRAM cells, layers, or structures (not shown in FIG. 3A). ReRAM cell 300 includes first electrode 304 and second electrode 306. In some embodiments, first electrode 304 and/or second electrode 306 extend laterally to connect to other ReRAM cells, for example, in a cross-bar arrangement further described below. ReRAM cell 300 also includes resistive switching layer 308, which may be referred to as a resistive switching stack when it has multiple sub-layers. Resistive switching layer 308 is disposed between first electrode 304 and second electrode 306. In some embodiments, ReRAM cell 300 may include one or more other components, such as current steering elements, embedded resistors, transistors, and the like.

Resistive switching layer 308 includes multiple nanolaminate structures 310a-310e, each nanolaminate structure including a at least one first oxide layer 312 (i.e., a layer of an oxide of the first element) and at least one second oxide layer 314 (i.e., layers of the oxide of the second element). The number of nanolaminate structures in resistive switching layer 308 may be two, three, four, five, or more. In general, any number of nanolaminate structures may be presented in one resistive switching layer 308. Furthermore, any number of different oxides may be presented in each nanolaminate structure. One having ordinary skills in the art would understand the scaling aspects of this disclosure.

Each nanolaminate structure in resistive switching layer 308 has a specific targeted average atomic ratio of the first element to the second element. This ratio may be determined by the number of first oxide layers 312 and the number of second oxide layers 314. At least two nanolaminate structures in resistive switching layer 308 have different average atomic ratios of the first element to the second element. For example, nanolaminate structure 310a has three first oxide layers 312 and three second oxide layers 314, while nanolaminate structure 310b has two first oxide layers 312 and six second oxide layers 314. As such, the average atomic ratio of the first element to the second element in nanolaminate structure 310a is less than in nanolaminate structure 310b. Continuing with this example, nanolaminate structure 310c has two first oxide layers 312 and ten second oxide layers 314. As such, the average atomic ratio of the first element to the second element in nanolaminate structure 310b is less than in nanolaminate structure 310c.

When a resistive switching layer has three or more nanolaminate structures, some of these structures may have the same average atomic ratios of the first element to the second element. For example, each of nanolaminate structures 310a and 310e illustrated in FIG. 3A includes three first oxide layers 312 and three second oxide layers 314. As such, the number ratio of first oxide layers 312 to second oxide layers 314 is 1:1 for nanolaminate structures 310a and 310e. In the same example, each of nanolaminate structures 310b and 310d includes six first oxide layers 312 and two second oxide layers 314. As such, the number ratio of first oxide layers 312 to second oxide layers 314 is 3:1 for nanolaminate structures 310b and 310d. Finally, nanolaminate structure 310c includes ten first oxide layers 312 and two second oxide layers 314. As such, the number ratio of first oxide layers 312 to second oxide layers 314 is 5:1 for nanolaminate structure 310c.

The number ratios of first oxide layers 312 to second oxide layers 314 are representative of average atomic ratios of the first element to the second element in each nanolaminate structure. For purposes of this document, an atomic ratio of the first element to the second element is considered as an average for the entire volume of each nanolaminate structure. It would be understood by one having ordinary skills in the art that the atomic ratio of the first element to the second element may fluctuate within the volume of the nanolaminate structure depending on the forming order of first oxide layers 312 are second oxide layers 314, subsequent annealing operations that result in intermixing of these layers, and other factors. Furthermore, annealing may cause some of the first elements and/or some of the second elements to transfer through an interface between two adjacent nanolaminate structures, in particular when this interface is between a first oxide layer 312 of one nanolaminate structure and a second oxide layer 314 of the other nanolaminate structure. An example of such pair of nanolaminate structures is presented in FIG. 3A by nanolaminate structures 310a and 310b. However, this interface transfer may be minimal (and negligible) in comparison to the overall amounts of the first and second elements in the nanolaminate structures. In some embodiments, in order to minimize this interface transfer, the layers are arranged in such a way that any interface is between either two first oxide layers 312 (one from each nanolaminate structure) or between two second oxide layers 314 (one from each nanolaminate structure). Finally, annealing may also cause some of the first element and/or some of the second element to transfer through an interface between a nanolaminate structure and an electrode. Similar to the interface transfer between two nanolaminate structures, this interface transfer may be minimal (and negligible) in comparison to the overall amounts of the first and second elements in the nanolaminate structures.

In some embodiments, first oxide layers 312 and second oxide layers 314 may be arranged in each nanolaminate structure in such a way that the distribution of the first element to the second element in that nanolaminate structure is as close as possible to uniform. For example, when a nanolaminate structure has the same number of first oxide layers 312 and second oxide layers 314 and the layers are of roughly equal thickness, these layers may alternate in that nanolaminate structure. One such example is presented as nanolaminate structure 310a in FIG. 3A. Alternatively, first oxide layers 312 and second oxide layers 314 may be arranged in each nanolaminate structure in such a way that the distribution of the first element to the second element in that nanolaminate structure is gradual. This gradual distribution of the first and second elements may be used to avoid sharp changed in concentrations at interfaces of adjacent nanolaminate structures.

Figure 3B:
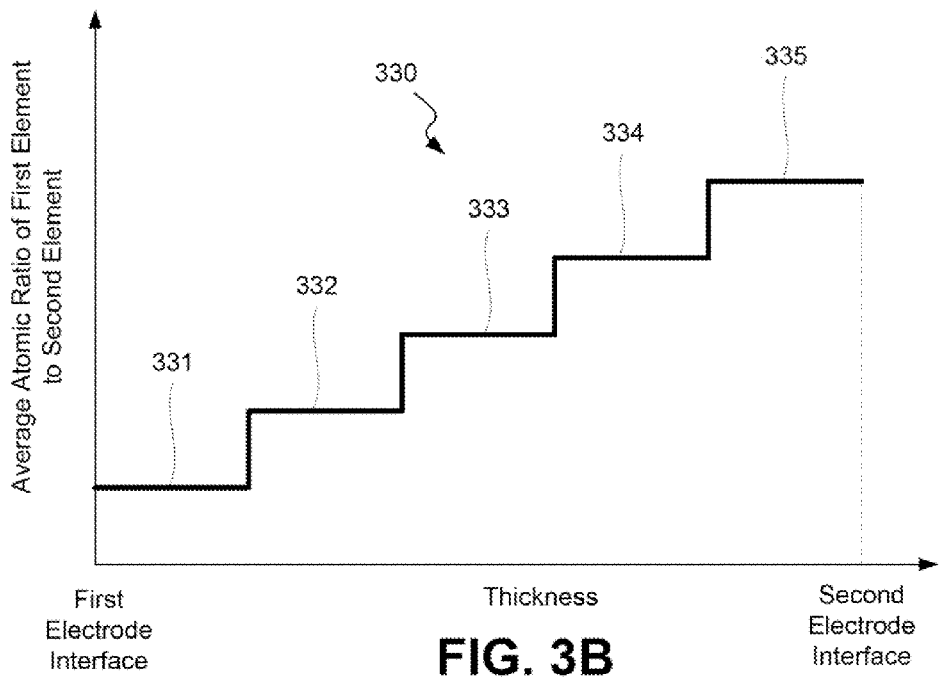
FIG. 3B is a plot of an average atomic ratio of the first element to the second element in a resistive switching layer as a function of the thickness, in accordance with some embodiments.

Considering the properties of the entire resistive switching layer 308, the average atomic ratio of the first element to the second element may increase from the region of the resistive switching layer near one electrode to the region near the other electrode. For example, the average atomic ratio of the first element to the second element may be the highest in a nanolaminate structure interfacing with one electrode and the lowest in a nanolaminate structure interfacing the other electrode. One such example is shown in FIG. 3B. Specifically, FIG. 3B illustrates profile 300 of average atomic ratios of the first element to the second element throughout the thickness of the entire resistive switching layer, in accordance with some embodiments. The resistive switching layer in this example includes five nanolaminate structures disposed between the first electrode and the second electrode. The nanolaminate structure interfacing the first electrode has the lowest average atomic ratio 331 of the first element to the second element, while the nanolaminate structure interfacing the second electrode has the highest average atomic ratio 335 of the first element to the second element. Average atomic ratios 332, 332, and 334 gradually increase with proximity to the second electrode interface. In some embodiments, the increase in the average atomic ratios from one electrode interface to the other may follow some other non-gradual profile, such as an exponential increase.

Alternatively, the average atomic ratio of the first element to the second element may be maximum or minimum in the resistive switching layer away from both electrode interfaces. For example, a nanolaminate structure separated from each electrode by at least one or more other nanolaminate structures may have the minimum or maximum average atomic ratio of the first element to the second element within the resistive switching layer. An example of such a ReRAM cell is shown in FIG. 3A. Specifically, nanolaminate structure 310c has the highest average atomic ratio of the first element to the second element among all five nanolaminate structures 310a-310e of this ReRAM cell 300.

Figure 3C:
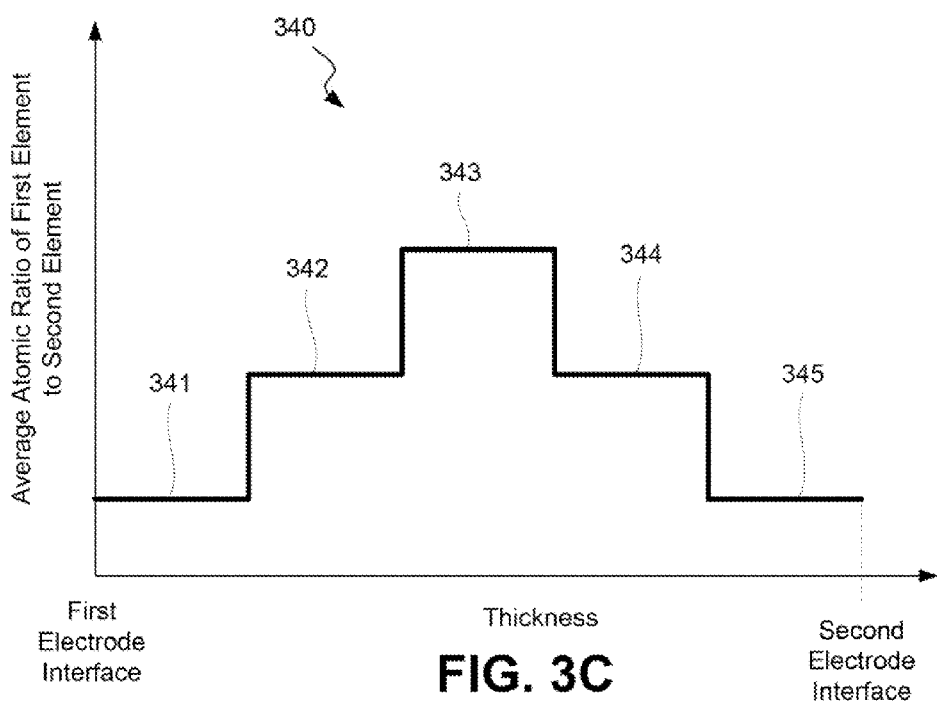
FIG. 3C is another plot of an average atomic ratio of the first element to the second element in a different resistive switching layer as a function of the thickness, in accordance with some embodiments.

FIG. 3C illustrates a profile 340 of average atomic ratios of the first element to the second element throughout the thickness of the entire resistive switching layer for such cells, in accordance with some embodiments. The resistive switching layer in this example also includes five nanolaminate structures disposed between the first electrode and the second electrode. The nanolaminate structure interfacing the first electrode has the lowest average atomic ratio 341 of the first element to the second element. The nanolaminate structure interfacing the second electrode also has the lowest average atomic ratio 345 of the first element to the second element. In some embodiments, average atomic ratios of the first element to the second element of the two nanolaminate structures interfacing the electrodes are substantially the same. As shown in FIG. 3C, average atomic ratios 342 and 343 gradually increase in the direction from the first electrode interface to the second electrode interface and then decrease from 343 to 344 and to 345 with atomic ratio 343 being the highest. For example, each nanolaminate structure may include at least one hafnium oxide layer and at least one titanium oxide layer. The ratio of hafnium to titanium may be the lowest in the nanolaminate structures interfacing the electrode and the highest in the middle of the resistive switching layer.

In some embodiments, a resistive random access memory cell includes a resistive switching layer having a first nanolaminate structure, a second nanolaminate structure, and a third nanolaminate structure, such that the second nanolaminate structure is disposed between the first nanolaminate structure and the second nanolaminate structure. Average atomic ratios of the first element to the second element differ between at least two of the nanolaminate structures. For example, an average atomic ratio of the first element to the second element in the first nanolaminate structure is less than an average atomic ratio of the first element to the second element in the second nanolaminate structure. At the same time, an average atomic ratio of the first element to the second element in the third nanolaminate structure may be different than the average atomic ratio of the first element to the second element in the second nanolaminate structure. Specifically, the average atomic ratio of the first element to the second element in the third nanolaminate structure is less than the average atomic ratio of the first element to the second element in the second nanolaminate structure. Referring to FIG. 3A, nanolaminate structure 310c may represent the second nanolaminate structure in this example, while either one of nanolaminate structure 310a, 310b, 310d, and 310e may represent either the first nanolaminate structure or the third nanolaminate structure in this example. In some more specific examples, the average atomic ratio of the first element to the second element in the third nanolaminate structure is about the same as the average atomic ratio of the first element to the second element in the first nanolaminate structure. For example, nanolaminate structures 310a and 310e in FIG. 3A may represent the first nanolaminate structure and the third nanolaminate structure or nanolaminate structures 310b and 310d in FIG. 3A may represent the first nanolaminate structure and the third nanolaminate structure.

In another example, an average atomic ratio of the first element to the second element in the first nanolaminate structure is less than an average atomic ratio of the first element to the second element in the second nanolaminate structure, while the average atomic ratio of the first element to the second element in the third nanolaminate structure is greater than the average atomic ratio of the first element to the second element in the second nanolaminate structure. Referring to FIG. 3A, nanolaminate structure 310c may represent the third nanolaminate structure in this example, nanolaminate structure 310b may represent the second nanolaminate structure, and nanolaminate structure 310a may represent the first nanolaminate structure.

In some embodiments, one nanolaminate structure may have at least twice as large an average atomic ratio of the first element to the second element than another structure. In some embodiments, the ratios may differ by a factor of 3 or more. For example, the average atomic ratio of the first element to the second element in the first nanolaminate structure is between about 0.5 and 2. In the same or another example, the average atomic ratio of the first element to the second element in the second nanolaminate structure is between about 2 and 4.

Examples of elements that could be included in the first and second oxides include hafnium, zirconium, aluminum, titanium, tantalum, and silicon. The electro-negativity values of these elements are presented in the table below:

TABLE

| Element | Electro-negativity value |
|---|---|
| Hafnium | 1.3 |
| Zirconium | 1.32 |
| Aluminum | 1.6 |
| Titanium | 1.38 |

TABLE-continued

| Element | Electro-negativity value |
|---|---|
| Tantalum | 1.5 |
| Silicon | 1.9 |

As noted above, the first element may be less electronegative than the second element. For example, the first element may be hafnium, while the second element may be one of zirconium, aluminum, titanium, tantalum, or silicon. Some other examples of tertiary oxides include HfAlOx, TiAlOx, TaHfOx, TaTiOx, and HfSiOx.

Returning to FIG. 3A, in some embodiments, the thickness of restive switching layer 308 is between about 20 and 100 Angstroms or, in some embodiments, between about 40 and 70 Angstroms, for example, about 50 Angstroms. The number of different oxide layers in restive switching layer 308 may be between about 20 and 100 or, in some embodiments, between about 40 and 70, for example, about 50.

In some embodiments, some or all of the oxide layers are formed from non-stoichiometric oxides. For example, first oxide layers 312 may be formed from non-stoichiometric oxides, while second oxide layers 314 may be formed from stoichiometric oxides. Alternatively, first oxide layers 312 may be formed from stoichiometric oxides, while second oxide layers 314 may be formed from non-stoichiometric oxides. In yet another example, both first oxide layers 312 and second oxide layers 314 may be formed from non-stoichiometric oxides.

In some embodiments, non-stoichiometric oxides may be present in all the nanolaminate structures. The deviation from stoichiometry may be the same in all nanolaminate structures or different. For example, one or more nanolaminate structures that do not interface the electrodes may have a higher deviation from stoichiometry than the nanolaminate structures interfacing the electrodes.

Electrodes 304 and 306 provide electronic communication to resistive switching layer 308 of ReRAM cell 300. One or both electrodes may directly interface resistive switching layer 308 or be separated from it by other layers, such as barrier layers, current limiting layers, and the like. Depending on the materials used for electrode construction, the electrode (e.g., an electrode formed from titanium nitride) itself may also serve as an adhesion layer and/or barrier layer. In certain embodiments, one or both electrodes are also function as signal lines (i.e., bit and/or word lines) and are shared by other ReRAM cells.

Some examples of electrode materials include silicon (e.g., n-doped poly-silicon and p-doped poly-silicon), silicides, silicide-germanides, germanides, titanium, titanium nitride (TiN), platinum, iridium, iridium oxide, ruthenium, ruthenium oxide, and the like. Generally, any sufficiently conductive material may be used to form an electrode. In some embodiments, barrier layers, adhesion layers, antireflection coatings and/or the like may be used with the electrodes and to improve device performance and/or aid in device fabrication.

In some embodiments, one electrode may be a higher work function material, and the other electrode may be a lower work function material than resistive switching layer. For example, a noble or near noble metal (i.e., a metal with a low absolute value free energy change ($|\Delta G|$) of oxide formation) may be used for one electrode. Specific examples include iridium, iridium oxide, platinum, ruthenium, and ruthenium oxide. The other electrode may be a lower work function material, such as titanium nitride. In these embodiments, the reset pulse at the electrode having the higher work function may be a positive pulse.

In some embodiments, one or both electrodes may be multi-layer electrodes formed by one or more different materials. For example, an electrode can include a base layer and capping layer. The base layer may include ruthenium, ruthenium oxide, iridium, iridium oxide, platinum, and various combinations thereof. The capping layer may include tungsten, tungsten carbonitride, and/or tungsten carbon. The multi-layer electrodes can be used to improve adhesion properties and performance of memory elements in some configurations and embodiments.

ReRAM cell 300 may include another layer (not shown) that is operable as a current limiting layer. A material for this layer may have a suitable work function for controlling the electron flow through ReRAM cell. This specific selection may alter the magnitude of the generated switching currents. In some embodiments, the current limiting layer is used to increase or decrease the formed barrier height at the interface with resistive switching layer 308. This feature is used to improve current flowing characteristics and reduce the magnitude of the switching currents. It should be noted that these changes in the barrier height will generally not affect the current ratio ($I_{ON}/I_{OFF}$), and thus does not impact detectability of different resistive states.

Processing Examples

Figure 4:
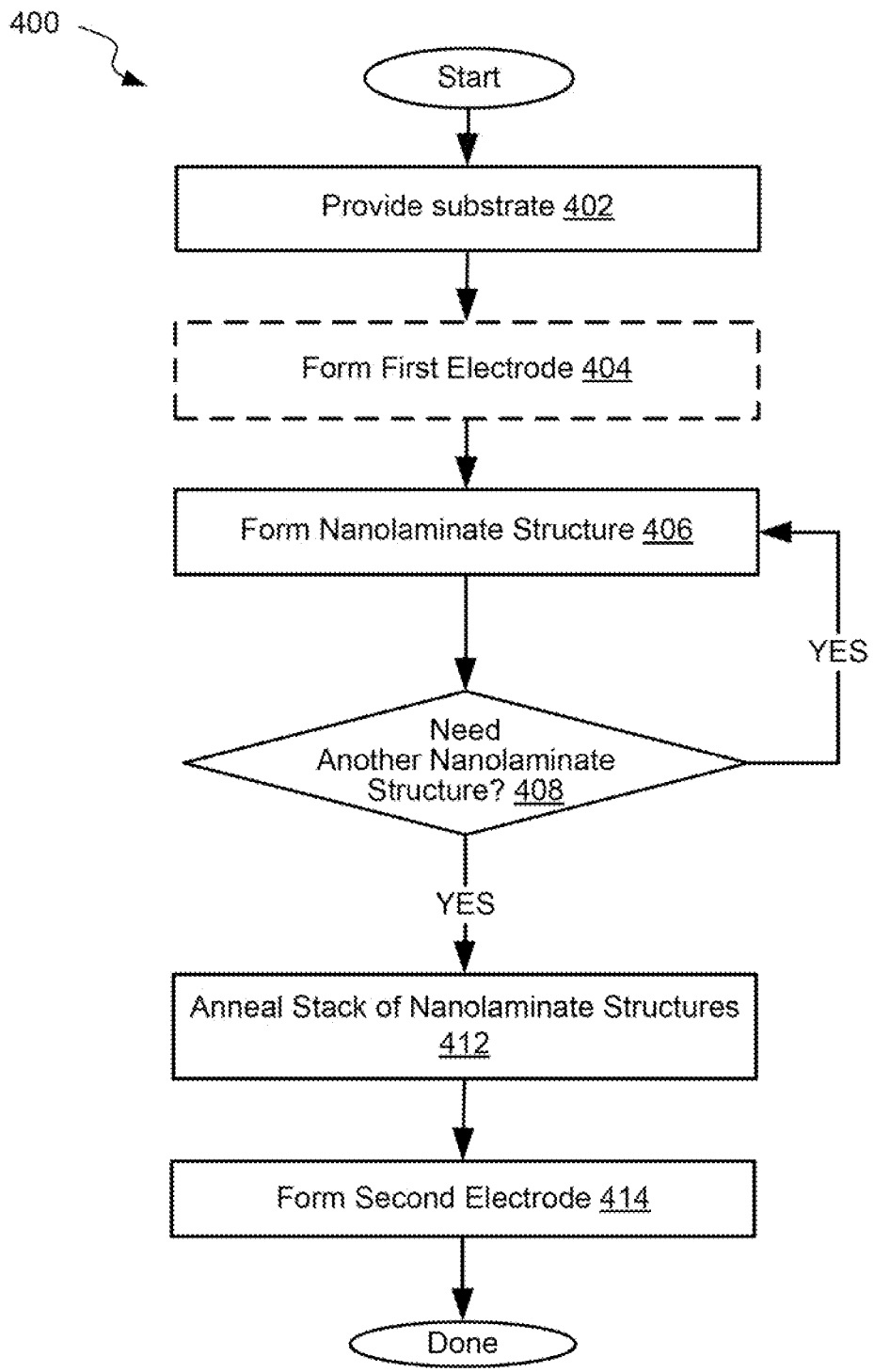
FIG. 4 illustrates a process flowchart corresponding to a method of fabricating a ReRAM cell, in accordance with some embodiments.

FIG. 4 illustrates a process flow chart corresponding to method 300 of fabricating a resistive random access memory cell, in accordance with some embodiments. Method 400 may commence with providing a substrate during operation 402. In some embodiments, the substrate may include a first electrode, in which case method 400 may proceed with forming nanolaminate structures of a resistive switching layer during operation 406. Alternatively, method 400 may proceed with forming a first electrode on the substrate during optional operation 404. For example, a titanium nitride electrode may be formed using sputtering. Deposition of the titanium nitride electrode may be performed using a titanium target in a nitrogen atmosphere maintained at a pressure of between about 1-20 mTorr. The power density may be maintained at 3.3-11 W/cm$^2$ (150-500 Watts on a 3" diameter target) that may result in a deposition rate of about 0.5-5 Angstroms per second (depending on the size of the target sample and other process parameters). Some of the provided process parameters are for illustrative purposes only and generally depend on deposited materials, tools, deposition rates, and other factors.

Method 400 may then proceed with forming a nanolaminate structure over the first electrode during operation 406. The nanolaminate structure may be formed using an ALD technique as further described below. Each nanolaminate structure formed during operation 406 includes at least one first oxide layer (a layer of an oxide of a first element) and at least one second oxide layer (a layer of an oxide of a second element). A separate ALD cycle may be used to form a first oxide layer. Likewise, a separate ALD cycle may be used to form a second oxide layer. One or both of these ALD cycles may be repeated to form a required number of first and second oxide layers in each nanolaminate structure. Furthermore, the order of these ALD cycles determines the positions of the first and second oxide layers within each nanolaminate structure.

Each ALD cycle involves the following four steps: introducing one or more precursors into the deposition chamber to form an adsorbed layer, followed by purging the unadsorbed precursor and any superfluous by-products from the chamber, and then introducing reactive agents that will react with the adsorbed layer to form a portion of or the entire oxide layer, followed by purging the unreacted reactive agents and any superfluous by-products from the chamber. Selection of precursors and processing conditions depend on desired composition, morphology, and structure of each portion of the electrode.

A layer formed during each atomic layer deposition cycle described above may be between about 0.25 and 2 Angstroms thick, averaged over the area of the layer. The cycle may be repeated multiple times until the overall base layer (and subsequently the resistive switching layer) reaches it desired thickness. In some embodiments, successive ALD cycles use different precursors.

ALD techniques are now briefly described to provide better understanding of various processing features. A precursor containing the first element or the second element is introduced into the ALD chamber and allowed to flow over the substrate surface (which may be a top surface of a previously deposited ALD layer). The precursor may be introduced in the form of a pulse.

The introduced precursor adsorbs (e.g., saturatively chemisorbs or physisorbs) on the deposition surface. Subsequent purging with a purging gas removes unreacted precursors, reaction products, and other undesirable components from the chamber.

In some embodiments, purging is performed before full saturation of the substrate surface occurs with the precursors. In other words, additional precursor molecules could have been further adsorbed on the substrate surface if the purging was not initiated so early. Without being restricted to any particular theory, it is believed that partial saturation can be used to introduced defects into the formed layer, e.g., during forming of a resistive switching layer.

After the initial precursor pulsing and purging of one or more precursors for the first or second element, a subsequent pulse introduces an oxidizing agent. The oxidizing agent reacts with the adsorbed element to form oxides. Reaction byproducts and excess reactants are purged from the deposition chamber. The saturation during the reaction and purging stages makes the growth self-limiting. This feature helps to improve deposition uniformity and conformality and allows more precise control of the resulting resistive switching characteristics.

The temperature of the substrate during atomic layer deposition may be between about 200° C. to 350° C. The precursor may be either in gaseous phase, liquid phase, or solid phase. If a liquid or solid precursor is used, then it may be transported into the chamber an inert carrier gas, such as helium or nitrogen.

Some examples of hafnium containing precursors include bis(tert-butylcyclopentadienyl) dimethyl hafnium ($C_{20}H_{32}Hf$), bis(methyl-η5-cyclopentadienyl) methoxymethyl hafnium ($HfCH_3(OCH_3)[C_5H_4(CH_3)]_2$), bis(trimethylsilyl) amido hafnium chloride ($[[(CH_3)_3Si]_2N]_2HfCl_2$), dimethylbis(cyclopentadienyl) hafnium (($C_5H_5)_2Hf((CH_3)_2$), hafnium isopropoxide isopropanol adduct ($C_{12}H_{28}HfO_4$), tetrakis(diethylamido) hafnium ($[(CH_2CH_3)_2N]_4Hf$)—also known as TEMAH, tetrakis(ethylmethylamido) hafnium ($[(CH_3)(C_2H_5)N]_4Hf$), tetrakis(dimethylamido) hafnium ($[(CH_3)_2N]_4Hf$)—also known as TDMAH, and hafnium tert-butoxide (HTB). Some hafnium containing precursors can be represented with a formula (RR'N) 4Hf, where R and R' are independent hydrogen or alkyl groups and may be the same or different. Some examples of aluminum containing precursors include aluminum tris (2,2,6,6-tetramethyl-3,5-heptanedionate) ($Al(OCC(CH_3)_3CHCOC(CH_3)_3)_3$), triisobutyl aluminum ($[(CH_3)_2CHCH_2]_3Al$), trimethyl aluminum ($(CH_3)_3Al$)—also known as TMA, Tris (dimethyl amido) aluminum ($Al(N(CH_3)_2)_3$). Some examples of titanium containing precursors include titanium chloride (TiCl4), titanium iodine (TiI4), bis(tert-butylcyclopentadienyl) titanium dichloride (C18H26Cl2Ti), bis(diethylamido)bis(dimethylamido)titanium (Ti(N(CH3)2)2(N(CH2CH3)2)2), tetrakis(diethylamido)titanium ([(C2H5)2N]4Ti), tetrakis(dimethylamido)titanium ([(CH3)2N]4Ti), tetrakis(ethylmethylamido) titanium ([(CH3C2H5)N]4Ti), titanium diisopropoxidebis(2, 2,6,6-tetramethyl-3,5-heptanedionate) (Ti[OCC(CH3) 3CHCOC(CH3)3]2(OC3H7)2), and titanium isopropoxide (Ti[OCH(CH3)2]4). Some example of tantalum containing precursors include pentakis (dimethylamino) tantalum (Ta(N (CH3)2)5), tris(diethylamido) (tert-butylimido) tantalum ((CH3)3CNTa(N(C2H5)2)3), tris(diethylamido) (ethylimido) tantalum (C2H5NTa(N(C2H5)2)3), tris(ethylmethylamido) (tert-butylimido) tantalum (C13H33N4Ta). Examples of zirconium containing precursors include bis (cyclopentadienyl)zirconium(IV)dihydride ($C_{10}H_{12}Zr$), bis (methyl-η5-cyclopentadienyl) methoxymethylzirconium (Zr ($CH_3C_5H_4)_2CH_3OCH_3$), dimethylbis(pentamethylcyclopentadienyl)zirconium($C_{22}H_{36}Zr$), tetrakis(diethylamido)zirconium ($[(C_2H_5)_2N]_4Zr$), tetrakis (dimethylamido)zirconium ($[(CH_3)_2N]_4Zr$), tetrakis(ethylmethylamido)zirconium ($Zr(NCH_3C_2H_5)_4$), zirconium dibutoxide(bis-2,4-pentanedionate) ($C_{18}H_{32}O_6Zr$), zirconium diisopropoxidebis(2,2,6,6-tetramethyl-3,5-heptanedionate) ($Zr(OCC(CH_3)_3CHCOC(CH_3)_3)_2(OC_3H_7)_2$), zirconium 2-ethylhexanoate ($Zr(C_8H_{15}O_2)_4$), zirconium tetrakis(2,2,6, 6-tetramethyl-3,5-heptanedionate) ($Zr(OCC(CH_3)_3CHCOC (CH_3)_3)_4$).

The oxidizing agent may include water ($H_2O$), peroxides (organic and inorganic, including hydrogen peroxide $H_2O_2$), oxygen ($O_2$), ozone ($O_3$), oxides of nitrogen (NO, $N_2O$, $NO_2$, $N_2O_5$), alcohols (e.g., ROH, where R is a methyl, ethyl, propyl, isopropyl, butyl, secondary butyl, or tertiary butyl group, or other suitable alkyl group), carboxylic acids (RCOOH, where R is any suitable alkyl group as above), and radical oxygen compounds (e.g., O, $O_2$, $O_3$, and OH radicals produced by heat, hot-wires, and/or plasma).

The ALD cycles repeated until the entire nanolaminate structure is formed. As noted above, each nanolaminate structure includes at least one first oxide layer and at least one second oxide layer. Therefore, each operation 406 may include at least two ALD cycles; one to deposit a first oxide layer and one to deposit a second oxide layer. Overall, the number of cycles, precursors used in each cycle, and processing conditions of each cycle is determined by the design of each nanolaminate structure as described above with reference to FIGS. 3A-3C.

Furthermore, operation 406 is repeated at least once to form an additional nanolaminate structure. At least some conditions of operation 406 are changed at least once to ensure that average atomic ratios of the first element to the second element in two of the nanolaminate structures in the resistive switching layer are different.

Method 400 may proceed with annealing of the resistive switching layer during operation 412. Annealing 412 may be performed before or after forming the second electrode during operation 414. In some embodiments, annealing 412 is performed on a partially formed resistive switching layer, e.g., a layer including some but not all nanolaminate structures.

Finally method 400 may proceed with forming a second electrode during operation 414. The second electrode may also be deposited in a manner similar to the first electrode as described above with reference to operation 404. Other layers, such as interface or capping layers, current limiting layers, and other layer may be deposited in the stack, e.g., between the top electrode and the resistive switching layer and/or between the bottom electrode and the resistive switching layer.

Apparatus Examples

Figure 5:
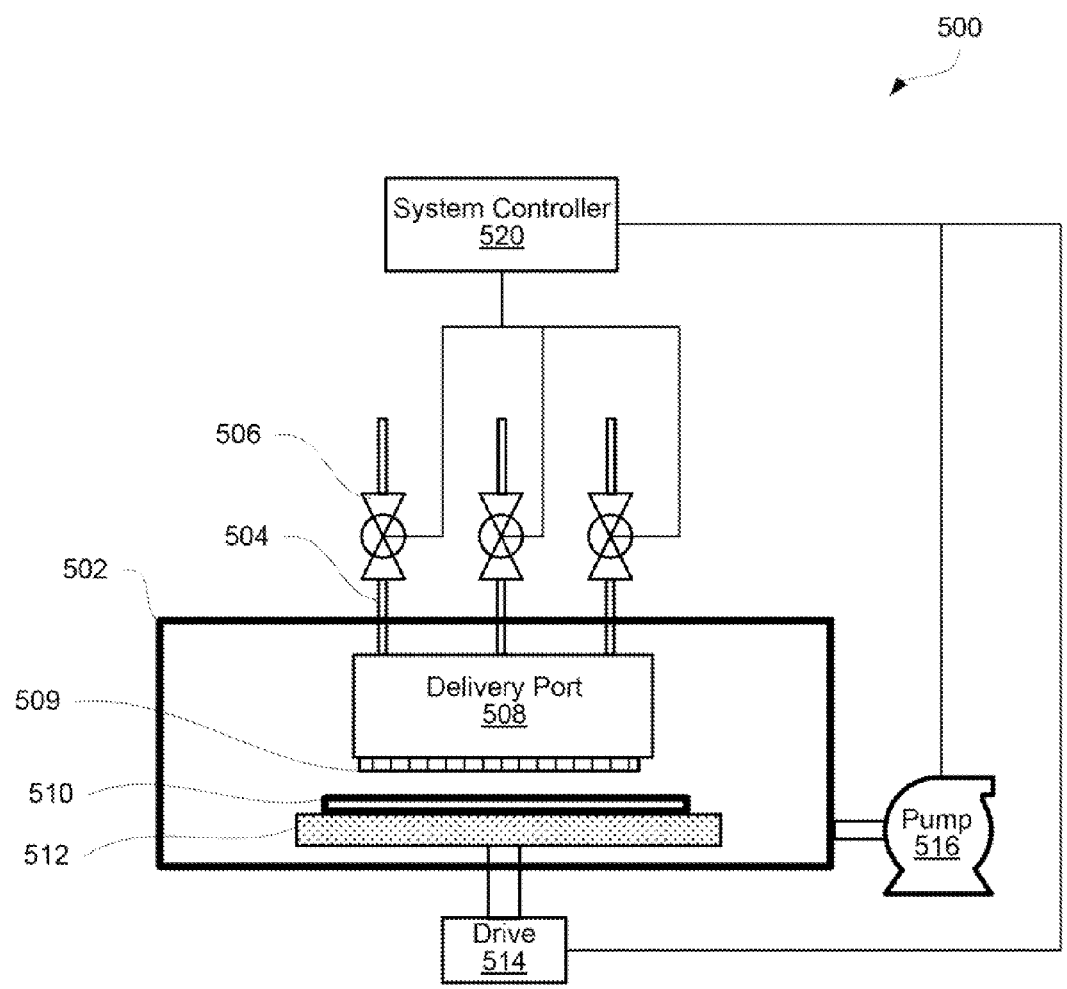
FIG. 5 illustrates a schematic representation of an atomic layer deposition (ALD) apparatus for fabricating ReRAM cells, in accordance with some embodiments.

FIG. 5 illustrates a schematic representation of atomic layer deposition apparatus 500 for fabricating ReRAM cells, in accordance with some embodiments. For clarity, some components of apparatus 500 are not included in this figure, such as a wafer-loading port, wafer lift pins, and electrical feed-throughs. Apparatus 500 includes deposition chamber 502 connected to processing gas delivery lines 504. While FIG. 5 illustrates three delivery lines 504, any number of delivery lines may be used. Each line may be equipped with a valve and/or mass flow controller 506 for controlling the delivery rates of processing gases into deposition chamber 502. In some embodiments, gases are provided into delivery port 508 prior to exposing substrate 510 to processing gases. Delivery port 508 may be used for premixing gases (e.g., precursors and diluents) and evenly distributing the gases over the surface of substrate 510. Delivery port 508 is sometimes referred to as a showerhead. Delivery port 508 may include a diffusion plate 509 having with multiple holes for gas distribution.

Deposition chamber 502 encloses substrate support 512 for holding substrate 510 during its processing. Substrate support 512 may be made from a thermally conducting metal (e.g., W, Mo, Al, Ni) or other like materials (e.g., a conductive ceramic) and may be used to maintain the substrate temperature at desired levels. Substrate support 512 may be connected to drive 514 for moving substrate 510 during loading, unloading, process set-up, and sometimes even during processing. Deposition chamber 502 may be connected to vacuum pump 516 for evacuating reaction products and unreacted gases from deposition chamber 502 and for maintaining the desirable pressure inside chamber 502.

Apparatus 500 may include system controller 520 for controlling process conditions during electrode and resistive switching layer deposition and other processes. Controller 520 may include one or more memory devices and one or more processors with a CPU or computer, analog and/or digital input/output connections, stepper motor controller boards, etc. In some embodiments, controller 520 executes system control software including sets of instructions for controlling timing, gas flows, chamber pressure, chamber temperature, substrate temperature, RF power levels (if RF components are used, e.g., for process gas dissociation), and other parameters. Other computer programs and instruction stored on memory devices associated with controller may be employed in some embodiments.

Memory Array Examples

Figure 6A:
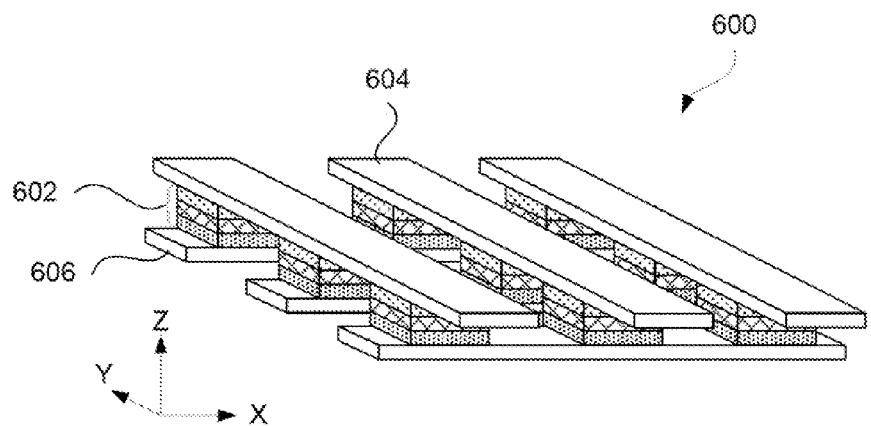
FIGS. 6A and 6B illustrate schematic views of memory arrays including multiple ReRAM cells, in accordance with some embodiments.

A brief description of memory arrays will now be described with reference to FIGS. 6A and 6B to provide better understanding to various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 6A illustrates a memory array 600 including nine ReRAM cells 602, in accordance with some embodiments. In general, any number of ReRAM cells may be arranged into one array. Connections to each ReRAM cell 602 are provided by signal lines 604 and 606, which may be arranged orthogonally to each other. ReRAM cells 602 are positioned at crossings of signal lines 604 and 606 that typically define boundaries of each ReRAM cell in array 600.

Signal lines 604 and 606 are sometimes referred to as word lines and bit lines. These lines are used to read and write data into each ReRAM cell 602 of array 600 by individually connecting ReRAM cells to read and write controllers. Individual ReRAM cells 602 or groups of ReRAM cells 602 can be addressed by using appropriate sets of signal lines 604 and 606. Each ReRAM cell 602 typically includes multiple layers, such as top and bottom electrodes, resistive switching layer, embedded resistors, embedded current steering elements, and the like, some of which are further described elsewhere in this document. In some embodiments, a ReRAM cell includes multiple resistive switching layers provided in between a crossing pair of signal lines 604 and 606.

As stated above, various read and write controllers may be used to control operations of ReRAM cells 602. A suitable controller is connected to ReRAM cells 602 by signal lines 604 and 606 and may be a part of the same memory device and circuitry. In some embodiments, a read and write controller is a separate memory device capable of controlling multiple memory devices, each one containing an array of ReRAM cells. Any suitable read and write controller and array layout scheme may be used to construct a memory device from multiple ReRAM cells. In some embodiments, other electrical components may be associated with the overall array 600 or each ReRAM cell 602. For example, to avoid the parasitic-path-problem, i.e., signal bypasses by ReRAM cells in their low resistance state (LRS), serial elements with a particular non-linearity must be added at each node or, in some embodiments, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, in some embodiments, embedded into each cell to decouple the cell if it is not addressed. This approach significantly reduces crosstalk in the matrix of the memory device.

Figure 6B:
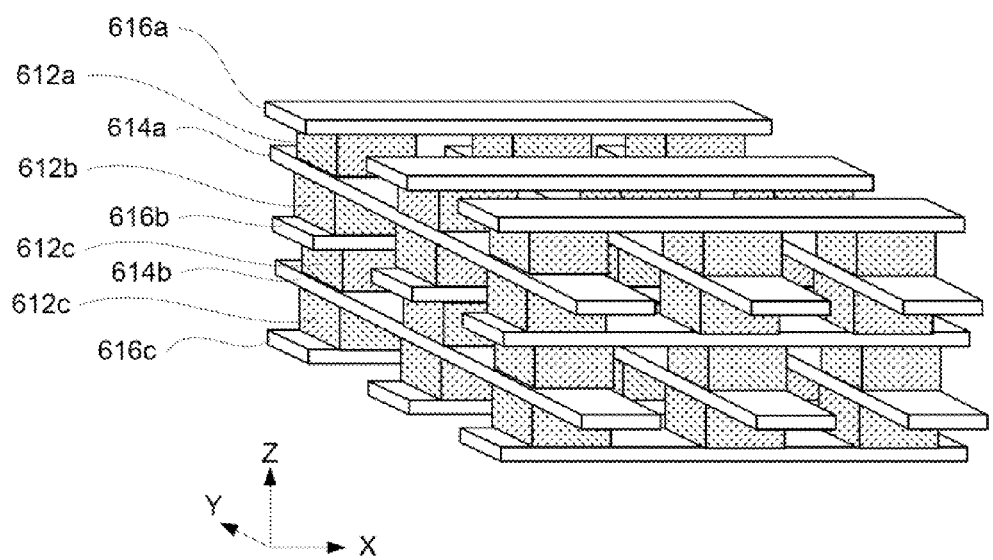

In some embodiments, a memory device may include multiple array layers as, for example, illustrated in FIG. 6B. In this example, five sets of signal lines 614a-b and 616a-c are shared by four ReRAM arrays 612a-c. As with the previous example, each ReRAM array is supported by two sets of signal lines, e.g., array 612a is supported by 614a and 616a. However, middle signal lines 614a-b and 616b, each is shared by two sets of ReRAM arrays. For example, signal line set 614a provides connections to arrays 612a and 612b. Top and bottom sets of signal lines 616a and 616c are only used for making electrical connections to one array. This 3-D arrangement of the memory device should be distinguished from various 3-D arrangements in each individual ReRAM cell.

CONCLUSION

Although the foregoing concepts have been described in some detail for purposes of clarity of understanding, it will be apparent that certain changes and modifications may be practiced within the scope of the appended claims. It should be noted that there are many alternative ways of implementing the processes, systems, and apparatuses. Accordingly, the present embodiments are to be considered as illustrative and not restrictive.

What is claimed is:

1. A method of fabricating a resistive random access memory cell, the method comprising:
providing a first conductive layer on a substrate;
forming a first nanolaminate structure over the first conductive layer; and forming a second nanolaminate structure over the first nanolaminate structure;
  wherein the first conductive layer is operable as an electrode;
  wherein the first nanolaminate structure and the second nanolaminate structure are formed using an atomic layer deposition technique;
  wherein the first nanolaminate structure and the second nanolaminate structure each comprise at least one first oxide layer and at least one second oxide layer;
  wherein the first oxide layer comprises an oxide of a first element and the second oxide layer comprises an oxide of a second element;
  wherein the first element is less electronegative than the second element;
  wherein an average atomic ratio of the first element to the second element in the first nanolaminate structure is less than an average atomic ratio of the first element to the second element in the second nanolaminate structure, and
  wherein at least one of the first nanolaminate structure and the second nanolaminate structure is switchable between a high resistance state and a low resistance state.

2. The method of claim 1, wherein the average atomic ratio of the first element to the second element in the first nanolaminate structure is more than 50% less than the average atomic ratio of the first element to the second element in the second nanolaminate structure.

3. The method of claim 1, further comprising forming a third nanolaminate structure over the second nanolaminate structure, wherein the third nanolaminate structure comprises at least one of the first oxide layer and at least one of the second oxide layer, wherein an average atomic ratio of the first element to the second element in the third nanolaminate structure is different than the average atomic ratio of the first element to the second element in the second nanolaminate structure.

4. The method of claim 3, wherein the average atomic ratio of the first element to the second element in the third nanolaminate structure is less than the average atomic ratio of the first element to the second element in the second nanolaminate structure.

5. The method of claim 4, wherein the average atomic ratio of the first element to the second element in the third nanolaminate structure is about the same as the average atomic ratio of the first element to the second element in the first nanolaminate structure.

6. The method of claim 3, wherein the average atomic ratio of the first element to the second element in the third nanolaminate structure is greater than the average atomic ratio of the first element to the second element in the second nanolaminate structure.

7. The method of claim 6, wherein the average atomic ratio of the first element to the second element in the third nanolaminate structure is at least four times greater than the average atomic ratio of the first element to the second element in the first nanolaminate structure.

8. The method of claim 1, wherein the average atomic ratio of the first element to the second element in the first nanolaminate structure is between about 0.5 and about 2.

9. The method of claim 1, wherein the average atomic ratio of the first element to the second element in the second nanolaminate structure is between about 2 and about 4.

10. The method of claim 1, further comprising forming a second conductive layer over the second nanolaminate structure;
  wherein the second conductive layer is operable as an electrode;
  wherein the switchable nanolaminate structure is disposed between the first conductive layer and the second conductive layer;
  and wherein a nanolaminate structure having a highest average atomic ratio of the first element to the second element is separated by at least one other nanolaminate structure from the first conductive layer and separated by at least one other nanolaminate structure from the second conductive layer.

11. The method of claim 1, further comprising forming a second conductive layer over the second nanolaminate structure;
  wherein the second conductive layer is operable as an electrode;
  wherein the switchable nanolaminate structure is disposed between the first conductive layer and the second conductive layer; and
  wherein a nanolaminate structure having a highest average atomic ratio of the first element to the second element interfaces one of the first conductive layer or the second conductive layer.

12. The method of claim 1, wherein the first nanolaminate structure is formed by depositing an equal number of the first oxide layer and the second oxide layer.

13. The method of claim 12, wherein the first oxide layer and the second oxide layer alternate in the first nanolaminate structure.

14. The method of claim 1, wherein the first element comprises hafnium.

15. The method of claim 14, wherein the second element comprises one of zirconium, aluminum, titanium, tantalum, or silicon.

16. The method of claim 14, wherein the second element comprises titanium.

17. The method of claim 1, wherein a material of at least one of the first oxide layer or the second oxide layer of the second nanolaminate structure comprises a non-stoichiometric oxide.

18. The method of claim 17, wherein a material of at least one of the first oxide layer or the second oxide layer of the first nanolaminate structure comprises a non-stoichiometric oxide.

19. The method of claim 1, wherein a thickness of the resistive switching layer is between about 20 Angstroms and 100 Angstroms.

20. A resistive random access memory cell comprising:
  a first conductive layer;
  a second conductive layer; and
  a variable resistance layer disposed between the first conductive layer and the second conductive layer;
    wherein the first conductive layer and the second conductive layer are operable as electrodes;
    wherein the variable resistance layer comprises a first nanolaminate structure and a second nanolaminate structure,
    wherein the first nanolaminate structure and the second nanolaminate structure each comprise at least one first oxide layer and at least one second oxide layer;
    wherein the first oxide layer comprises an oxide of a first element and the second oxide layer comprises an oxide of a second element; and
    wherein an average atomic ratio of the second element to the first element in the first nanolaminate structure is different from an average atomic ratio of the second element to the first element in the second nanolaminate structure.

* * * * *